(12) United States Patent
Vaisanen (10) Patent No.: US 7,844,233 B2
(45) Date of Patent: Nov. 30, 2010

(54) PASSIVE AMPLIFICATION OF SIGNALS

(75) Inventor: Risto Vaisanen, Salo (FI)

(73) Assignee: Nokia Corporation, Espoo (FI)

( * ) Notice: Subject to any disclaimer, the term of this patent is extended or adjusted under 35 U.S.C. 154(b) by 893 days.

(21) Appl. No.: 11/707,011

(22) Filed: Feb. 16, 2007

(65) Prior Publication Data

US 2008/0001659 A1  Jan. 3, 2008

(30) Foreign Application Priority Data

Jun. 30, 2006  (FI) ................................. 20065464
Dec. 28, 2006  (FI) ................................. 20065861

(51) Int. Cl.
*H04B 1/04* (2006.01)
(52) U.S. Cl. ............... 455/127.1; 455/232.1; 455/127.3
(58) Field of Classification Search ... 455/127.1–127.5, 455/126, 232.1–250.2
See application file for complete search history.

(56) References Cited

U.S. PATENT DOCUMENTS

| | | | |
|---|---|---|---|
| 4,186,436 A | 1/1980 | Ishiwatari | |
| 4,398,099 A | 8/1983 | Benoit-Gonin et al. | |
| 4,797,899 A | 1/1989 | Fuller et al. | |
| 4,999,761 A | 3/1991 | Bingham et al. | |
| 5,126,590 A * | 6/1992 | Chern | 327/536 |
| 5,237,209 A | 8/1993 | Brewer | |
| 5,262,934 A | 11/1993 | Price | |
| 5,397,931 A | 3/1995 | Bayer | |
| 5,475,337 A | 12/1995 | Tatsumi | |
| 5,550,728 A | 8/1996 | Ellis | |
| 5,574,457 A | 11/1996 | Garrity et al. | |
| 5,581,454 A | 12/1996 | Collins | |
| 5,606,491 A | 2/1997 | Ellis | |
| 5,828,560 A | 10/1998 | Alderman | |
| 5,874,850 A * | 2/1999 | Pulvirenti et al. | 455/232.1 |
| 6,064,871 A | 5/2000 | Leung | |
| 6,091,940 A | 7/2000 | Sorrells et al. | |

(Continued)

FOREIGN PATENT DOCUMENTS

SE  470 298  1/1994

OTHER PUBLICATIONS

Jan Crols, et al., "A 1.5 GHz Highly Linear CMOS Downconversion Mixer," IEEE Journal of Solid-State Circuits, vol. 30, No. 7, Jul. 1995, pp. 736-742, IEEE, USA.

(Continued)

*Primary Examiner*—Lana N Le
(74) *Attorney, Agent, or Firm*—Squire, Sanders & Dempsey, LLP (57) ABSTRACT

A passive amplifier structure capable of multiplying the voltage of an input signal is provided. In a first stage, a first and a second capacitance are connected between a first and a second input port of a balanced input port in response to a first oscillator signal. In a second stage, in response to a second oscillator signal having a phase different from that of the first oscillator signal, the first capacitance is connected between the first input port and a third capacitance and the second capacitance is connected between the second input port and the third capacitance. An output voltage over the third capacitance is obtained from terminals of the third capacitance. Presented embodiments also describe an automatic gain control feature.

33 Claims, 7 Drawing Sheets

U.S. PATENT DOCUMENTS

| | | |
|---|---|---|
| 6,198,645 B1 | 3/2001 | Kotowski et al. |
| 6,429,632 B1 | 8/2002 | Forbes et al. |
| 6,675,003 B1 | 1/2004 | Dubash et al. |
| 6,999,747 B2 | 2/2006 | Su |
| 7,010,286 B2 | 3/2006 | Sorrells et al. |
| 7,039,382 B2 | 5/2006 | Shu |
| 7,062,248 B2 | 6/2006 | Kuiri |
| 7,212,588 B1 | 5/2007 | Wong et al |
| 7,218,899 B2 | 5/2007 | Sorrells et al. |
| 7,248,850 B2 | 7/2007 | Shen |
| 7,336,938 B1 | 2/2008 | Wong |
| 7,460,844 B2 | 12/2008 | Molnar et al. |
| 7,506,182 B2 * | 3/2009 | Taniguchi et al. ........ 455/127.1 |
| 7,630,700 B2 * | 12/2009 | Vaisanen .................... 455/313 |
| 2005/0134380 A1 | 6/2005 | Nairn |
| 2005/0176396 A1 | 8/2005 | Miyagi |
| 2007/0275684 A1 | 11/2007 | Harada et al. |
| 2008/0001659 A1 | 1/2008 | Vaisanen |
| 2008/0003973 A1 * | 1/2008 | Vaisanen .................... 455/326 |

OTHER PUBLICATIONS

International Search Report, International Patent Application No. PCT/FI2007/050389, Date of Completion: Oct. 17, 2007, Date of Mailing: Oct. 26, 2007, pp. 1-4.

International Search Report, International Application No. PCT/FI2007/050391, Date of Completion: Oct. 23, 2007, Date of Mailing: Oct. 26, 2007, pp. 1-2.

International Search Report PCT/FI2007/050390 filed Jun. 26, 2007.

Supplementary European Search Report, European Patent Application No. EP 07 78 8765, Date of Completion: Jun. 23, 2010, Date of Mailing: Jun. 30, 2010, 2 pages.

Communication pursuant to Article 94(3) EPC, European Patent Application No. 07 788 765.1-2215, Date: Jul. 20, 2010, pp. 1-3.

* cited by examiner

PRIOR ART

PASSIVE AMPLIFICATION OF SIGNALS

FIELD

The invention relates to passive amplification of received signals in a radio receiver.

BACKGROUND

Figure 1:
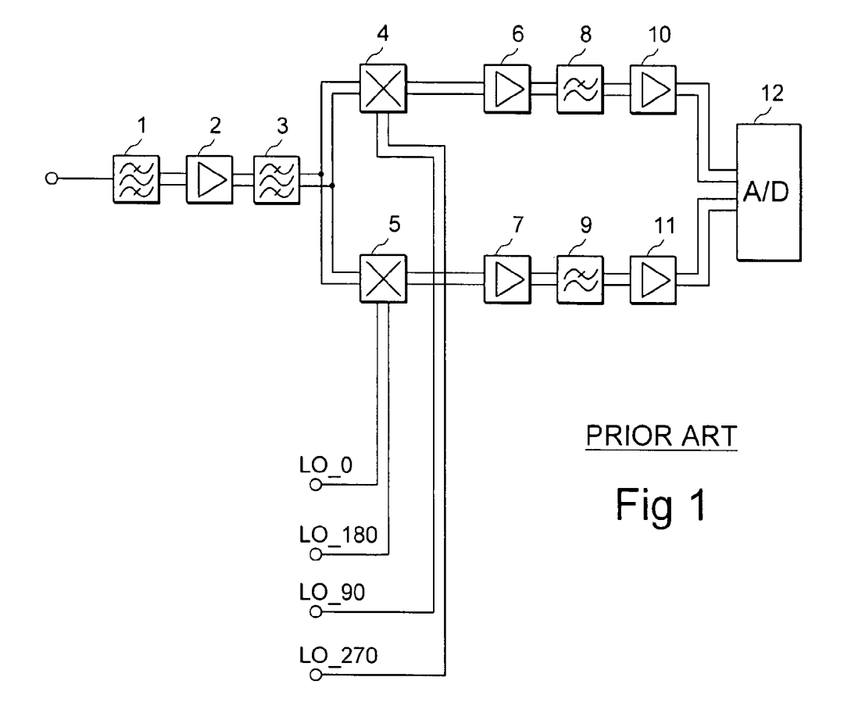
FIG. 1 illustrates an example of components of a radio receiver.

In radio transceivers, and particularly in direct-conversion receivers, amplifiers having low noise figures and capable of handling high-level signals are needed in front-ends of an in-phase (I) and a quadrature (Q) signal paths. FIG. 1 illustrates a receiver structure converting a received radio signal directly to the baseband. The receiver comprises a first amplifier 2 before mixers 4 and 5. The first amplifier 2 is typically a low-noise amplifier. Bandpass filters 1 and 3 have been provided before and after the amplifier 2 to remove undesired frequency components. Mixers 4 and 5 mix in-phase (I) and quadrature (Q) components of the received radio signal to the baseband with local oscillator signals LO_0, LO_90, LO_180, and LO_270. The number refers to the phase shift of the respective local oscillator signal. After the downmixing, baseband amplifiers 6 and 7 amplify the downmixed I and Q components, respectively, and low-pass filters 8 and 9 remove harmonic signal components resulting in the downmixing. Amplifiers 10 and 11 further amplify the low-pass filtered signals before analog-to-digital (A/D) conversion in an A/D-converter 12.

In case the baseband amplifiers 6 and 7 are active amplifiers, noise figures of the baseband amplifiers 6 and 7 are typically relatively poor due to flicker noise (known also as 1/f noise), among others. Nowadays, supply voltages applied to the active amplifiers 6 and 7 are quite low, which degrades their ability to handle input signals having large amplitudes. As a consequence, the amplifiers 6 and 7 may distort input signals severely causing difficulties in further processing of the input signals. Low-pass filters may be arranged to have low impedance levels in order to minimize noise levels. This may result in high capacitance values in the low-pass filter components and, as a consequence, increase the size of an actual implementation in an integrated circuit.

BRIEF DESCRIPTION OF THE INVENTION

An object of the invention is to provide an improved solution for amplifying a received radio signal.

According to an aspect of the invention, there is provided a method, comprising: receiving an input signal voltage into a first and a second input port of a balanced input port, connecting, in a first stage in response to a first oscillator signal, a first and a second capacitance between the first and the second input port of the balanced input port, connecting, in a second stage in response to a second oscillator signal, the first capacitance between the first input port and a third capacitance and the second capacitance between the second input port and the third capacitance, and obtaining the voltage over the third capacitance as an output voltage.

According to another aspect of the invention, there is provided a method, comprising: producing a first and a second oscillator signal having the same frequency, charging a first capacitance and a second capacitance with an input signal sample received into a first and a second input port of a balanced input port during the first half cycle of the oscillator signals, and charging a third capacitance operationally coupled with the first and the second capacitances, with the charges in the first and the second capacitances together with an input signal sample received into the first and the second input port of the balanced input port during the second half cycle of the oscillator signal.

According to another aspect of the invention, there is provided an apparatus, comprising an input interface comprising a balanced input port to receive a balanced input signal and a oscillator signal input port to receive a first and a second oscillator signal, a first, a second, and a third capacitance, a first set of switches responsive to the first oscillator signal and arranged to connect, in response to the first oscillator signal, the first and the second capacitance between a first and a second input port of the balanced input port, a second set of switches responsive to the second oscillator signal and arranged to connect, in response to the second oscillator signal, the first capacitance between the first input port and the third capacitance and the second capacitance between the second input port and the third capacitance, and an output port connected to terminals of the third capacitance.

According to another aspect of the invention, there is provided an apparatus, comprising input means comprising a balanced input port to receive a balanced input signal and an oscillator signal input port to receive a first and a second oscillator signal, first, second, and third capacitance means, first switching means responsive to the first oscillator signal and arranged to connect, in response to the first oscillator signal, the first and the second capacitance means between a first and a second input port of the balanced input port, second switching means responsive to the second oscillator signal and arranged to connect, in response to the second oscillator signal, the first capacitance means between the first input port and the third capacitance means and the second capacitance means between the second input port and the third capacitance means, and output means connected to terminals of the third capacitance means.

According to another aspect of the invention, there is provided an automatic gain control amplifier comprising the above-described apparatus.

According to another aspect of the invention, there is provided a radio transmitter comprising the above-described apparatus.

LIST OF DRAWINGS

In the following, the invention will be described in greater detail with reference to the embodiments and the accompanying drawings, in which.

DESCRIPTION OF EMBODIMENTS

Figure 2:
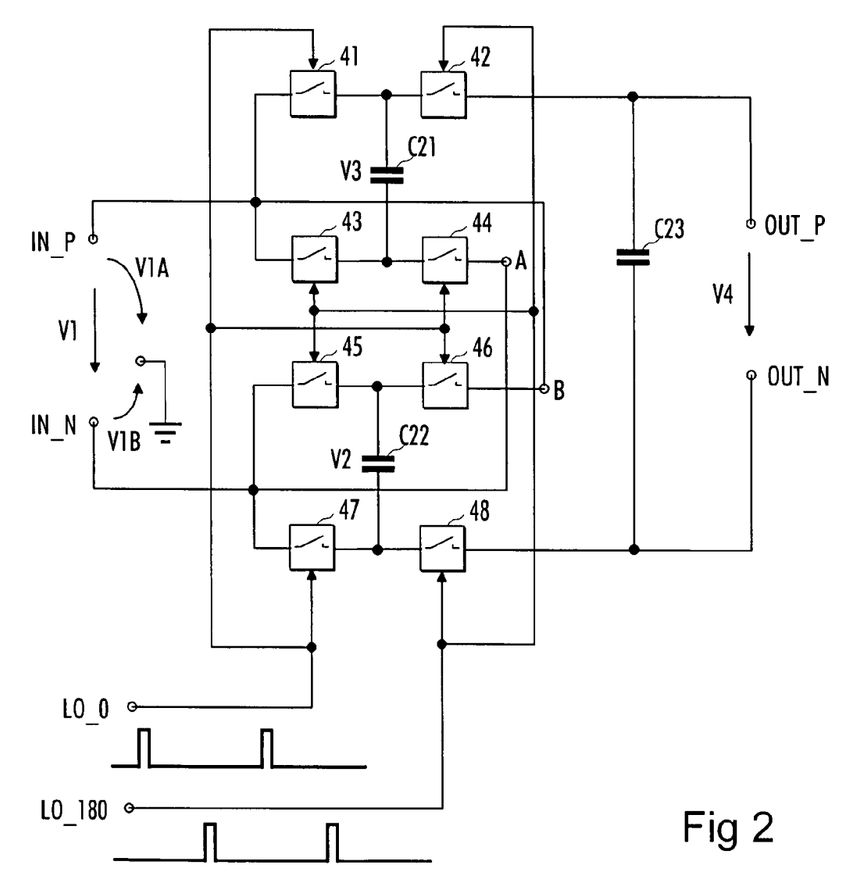
FIG. 2 illustrates a passive amplifier structure according to an embodiment of the invention.

FIG. 2 illustrates the structure of an apparatus according to an embodiment of the invention. The apparatus may be a baseband passive amplifier or a voltage multiplier implemented in a radio receiver. The amplifier may be located after a mixer converting a received radio frequency signal into the baseband.

The amplifier comprises an input interface including a balanced input port to receive a balanced input signal to be amplified. The balanced input port comprises a first and a second input port IN_P and IN_N to receive a balanced input signal. As known in the art, the balanced input signal comprises two components having opposite phases. Referring to FIG. 2, a signal input to the second input port IN_N is accordingly an inverted version of a signal input to the first input port IN_P.

The input interface further comprises an oscillator signal input port to receive a first and a second oscillator signal LO_0 and LO_180. A local oscillator may provide a local oscillator signal which may be modified into the first and the second oscillator signals LO_0 and LO_180 input to the oscillator signal input port of the amplifier. The oscillator signals LO_0 and LO_180 may be modified to have substantially the same frequency.

The amplifier according to the embodiment of the invention includes a first capacitance C21, a second capacitance C22, and a third capacitance C23. Additionally, the amplifier comprises a first set of switches responsive to the first oscillator signal LO_0 and a second set of switches responsive to the second oscillator signal LO_180. In the embodiment illustrated in FIG. 2, the first set of switches comprises a first switch 41, a second switch 44, a third switch 46, and a fourth switch 47. The first switch 41 may be disposed between the first input port IN_P of the balanced input port and a first terminal of the first capacitance C21. The second switch 44 may be disposed between a second terminal of the first capacitance and a first connection port A which is connected to the second input port IN_N of the balanced input port in this embodiment. The third switch 46 may be disposed between a first terminal of the second capacitance and a second connection port B which is connected to the first input port of the balanced input port in this embodiment. The fourth switch 47 may be disposed between the second input port of the balanced input port and a second terminal of the second capacitance.

The second set of switches may include a fifth switch 42, a sixth switch 43, a seventh switch 45, and an eighth switch 48. The fifth switch 42 may be disposed between the first terminal of the first capacitance and a first end of the third capacitance C23. The sixth switch 43 may be disposed between the first input port of the balanced input port and the second terminal of the first capacitance C21. The seventh switch 45 may be disposed between the second input port of the balanced input port and the first terminal of the second capacitance C22. The eighth switch 48 may be disposed between the second terminal of the second capacitance C22 and the second terminal of the third capacitance C23.

As described above, the first oscillator signal LO_0 may be applied to each switch of the first set of switches and the second oscillator signal LO_180 may be applied to each switch of the second set of switches.

Let us now consider the operation of the amplifier according to this embodiment of the invention during a clock cycle of the local oscillator signals LO_0 and LO_180. The clock cycle may be divided into two stages. In the first stage, the value of the first oscillator signal LO_0 is high and the value of the second oscillator signal LO_180 remains low. Accordingly, the first set of switches, i.e. the switches 41, 44, 46, and 47, is closed in the first stage. Thereby, the closed first set of switches forms a circuit illustrated in FIG. 3A. That is, the first and the second capacitance C21 and C22 are connected in parallel between the first and the second input port of the balanced input port. The first switch 41 connects the first terminal of the first capacitance C21 to the first input port and the second switch 44 connects the second terminal of the first capacitance C21 to the second input port. Correspondingly, the third switch 46 connects the first terminal of the second capacitance C22 to the first input port and the fourth switch 47 connects the second terminal of the second capacitance C22 to the second input port.

Figure 4:
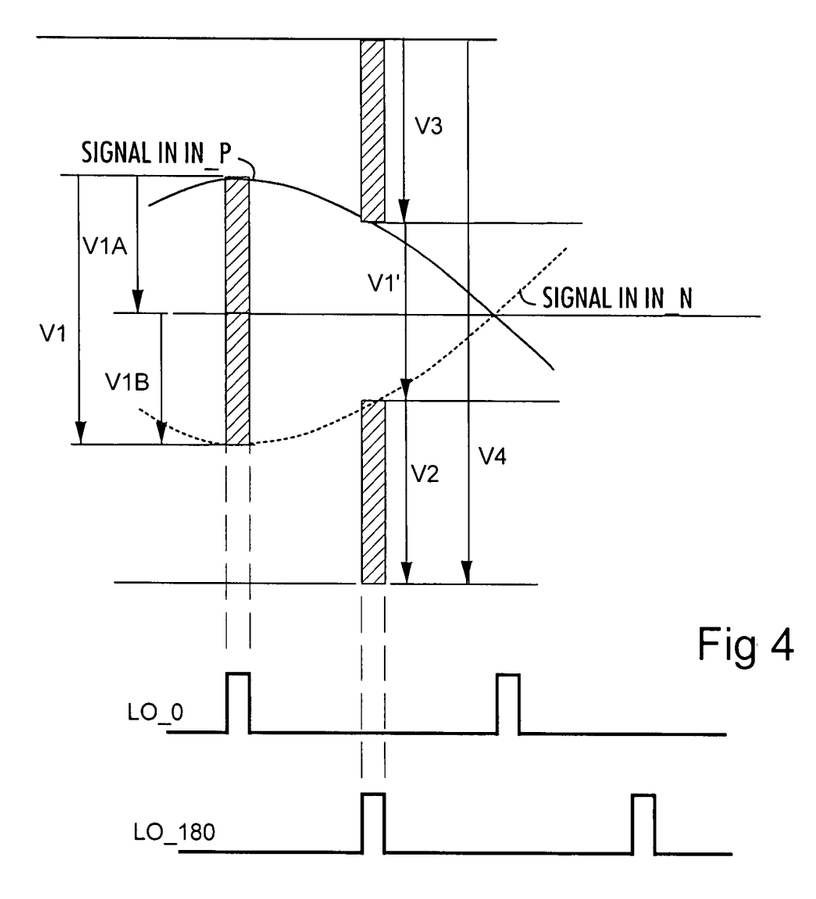
FIG. 4 illustrates signals input to the passive amplifier illustrated in FIG. 2 and voltage levels in components of the passive amplifier.

When connected in parallel between the first and the second input port, the first and the second capacitance are charged with a voltage corresponding to the voltage between the first and the second input port IN_P and IN_N. The voltages over the first and the second input port IN_P and IN_N are illustrated in FIG. 4. With reference to FIGS. 2 and 4, voltage V1A represents the voltage between the first input port and the ground level, and voltage V1B represents the voltage between the second input port and the ground level. Voltage V1 represents the voltage between the first and the second input port IN_P and IN_N, voltage V2 represents the voltage over the second capacitance C22, and voltage V3 represents the voltage over the first capacitance C21. Signals input into the input ports IN_P and IN_N are also illustrated in FIG. 4. Accordingly, the first and the second capacitance C21 and C22 are charged with voltage V1 in the first stage.

Figure 3A:
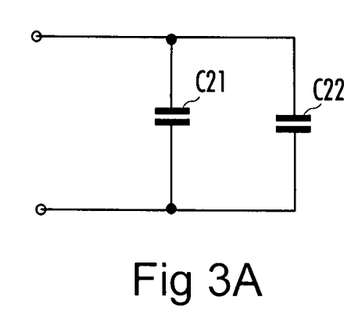
FIG. 3A illustrates an equivalent circuit in a first stage of the operation of the passive amplifier illustrated in FIG. 2.
Figure 3B:
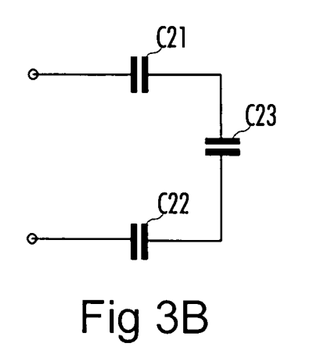
FIG. 3B illustrates an equivalent circuit in a second stage of the operation of the passive amplifier illustrated in FIG. 2.

In the second stage, the value of the first oscillator signal LO_0 is low and the value of the second oscillator signal LO_180 is high. Accordingly, the first set of switches, i.e. the switches 41, 44, 46, and 47, is open in the second stage, and the second set of switches, i.e. the switches 42, 43, 45, and 48, is closed. Thereby, the closed second set of switches forms a circuit illustrated in FIG. 3B. That is, the first capacitance C21 is connected in series with the second capacitance C22 and the third capacitance C23 between the first and the second input port. In more detail, the sixth switch 43 connects the second terminal of the first capacitance C21 to the first input port IN_P, and the fifth switch 42 connects the first terminal of the first capacitance C21 to the first terminal of the third capacitance C23. The rest of the circuit illustrated in FIG. 3B is formed by the seventh switch 45 connecting the first terminal of the second capacitance C22 to the second input port IN_N and the eighth switch 48 connecting the second terminal of the second capacitance C22 to the second terminal of the third capacitance C23.

Accordingly, the first and the second capacitance C21 and C22 release their charges into the third capacitance C23. In addition to the voltages in the first and the second capacitance C21 and C22, the third capacitance C23 is charged with the input voltage which sums up together with the voltages in the first and the second capacitance C21 and C22 in the second stage. Referring to FIG. 4, voltage V2 represents the voltage charged into the second capacitance C22 just before closing the second set of switches, and voltage V3 represents the voltage charged into the first capacitance C21 just before closing the second set of switches. In practice, voltages V2 and V3 roughly equal the voltage V1, if the level of the input signal has not changed significantly between the first and the second stage. Accordingly, the sum of voltages V2 and V2 is charged into the third capacitance C23 together with the current voltage V1' between the input ports of the balanced input port, i.e. the voltage V4 over the third capacitance C23 becomes V4=V1'+V2+V3. A first and a second output port OUT_P and OUT_N of a balanced output port may be connected to the first and the second terminal of the third capacitance C23, respectively. If the oscillator signal frequency is higher than the highest frequency component of the input signals IN1 and IN2 input to the input ports IN_P and IN_N, i.e. the voltages of the input signals IN1 and IN2 do not vary significantly over one period of the local oscillator signals LO_0 and LO_180, the input voltage V1 is roughly tripled. In other words, the amplification of the passive amplifier according to this embodiment of the invention is 9 dB, which is affected by the actual implementation and the properties of the components used in the amplifier. The amplification of 9 dB is obtained with a passive amplifier structure without an additional power supply (except the oscillator signals, of course).

The principles of the amplifier according to the embodiment of the invention are based on charging the first and the second capacitance C21 in the first stage and C22 and releasing the charges in the first and the second capacitance C21 and C22 in series with the input signal to the third capacitance C23 in the second stage. This operation of sequentially charging and discharging the first capacitance C21 makes the first capacitance C21 and the switches 41, 42, 43, and 44 (the first, second, fifth and sixth switch) to function as a resistor implemented with a switched capacitor filter (SC filter) technique.

Figure 5A:
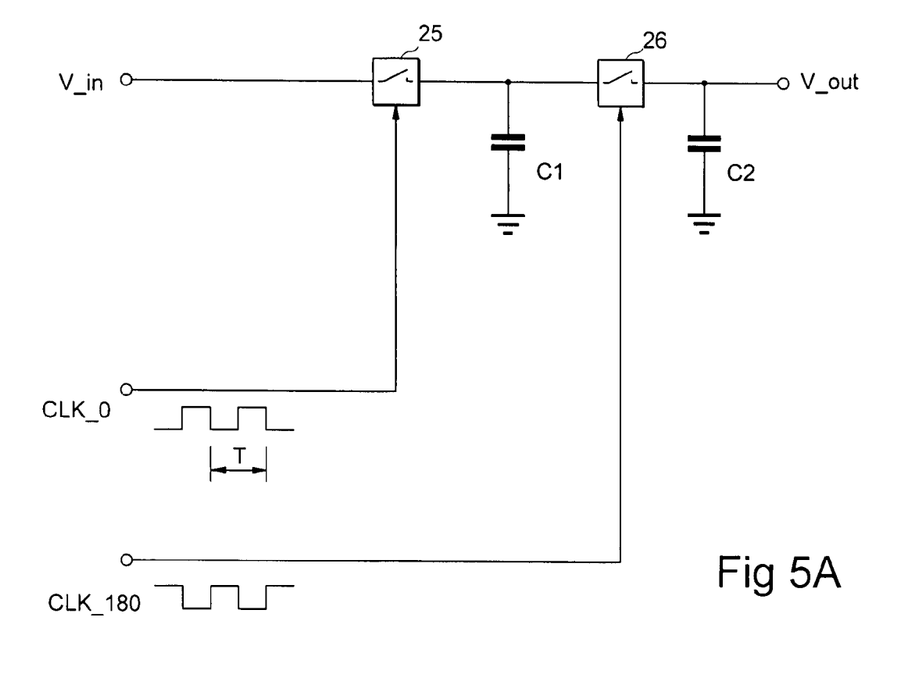
FIG. 5A illustrates an exemplary switched capacitor filter structure.
Figure 5B:
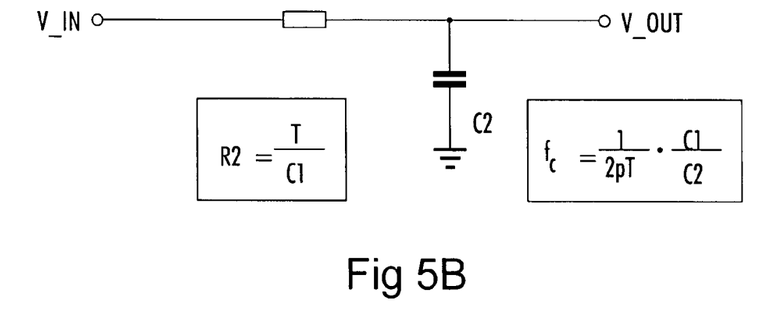
FIG. 5B illustrates an equivalent circuit diagram of the switched capacitor filter structure illustrated in FIG. 5A.

FIGS. 5A and 5B illustrate a schematic diagrams of a low-pass filter implemented with the SC filter technique (FIG. 5A) and its equivalent circuit (FIG. 5B). Switches 25 and 26 operated according to respective oscillator signals CLK_0 and CLK_180 and a first capacitor between the switches 25, 26 function as a resistor having a resistance R2=T/C1, where T is the period of the oscillator signals CLK_0 and CLK_180 and C1 is the capacitance of the first capacitor. V_in denotes an input port and V_out an output port of the filter. The equivalent circuit is illustrated in FIG. 5B in which the switches 25 and 26 and the first capacitor have been replaced with a resistor having resistance R2. Additionally, the SC filter includes a second capacitor connected in parallel to the second switch 26. The corner frequency of the SC filter is defined as:

$$f_c = \frac{1}{2\pi T} \cdot \frac{C1}{C2}, \tag{1}$$

where C2 is the capacitance of the second capacitor. It can be seen that if the frequency of the oscillator signals is constant, the corner frequency depends on the ratio of the capacitances C1 and C2. In CMOS implementations, the absolute capacitance values may have a high diversity, but the ratio of the capacitance values remains very stable and accurate. That is, the ratio C1/C2 remains quite constant regardless of variations in the absolute values of C1 and C2. Accordingly, the corner frequency may be defined accurately and it has only marginal variations.

Consequently, the amplifier according to an embodiment of the invention may be used as a low-pass filter by designing the components, i.e. the first, the second, and the third capacitance C21, C22, and C23, the switches 41 to 48 and the oscillator signals LO_0 and LO_180 properly. Now, the first, second, fifth, and sixth switch 41, 42, 43, and 44 and the first capacitance C21 function as a first resistor, and the third, fourth, seventh, and eighth switch 45, 46, 47, and 48 and the second capacitance C22 function as a second resistor. The corner frequency is defined by the ratio of the capacitance values of the first and the third capacitance C21 and C23 and the ratio of the capacitance values of the second and the third capacitance C22 and C23. If the capacitance value of the second capacitance C22 equals to that of the first capacitance C21, the corner frequency simplifies into $$f_c = \frac{1}{4\pi T} \cdot \frac{C21}{C23}.$$

Accordingly, the amplifier according to an embodiment of the invention is configured to function also as a low-pass filter having a corner frequency defined by capacitance values of the first, second, and third capacitance C21, C22, and C23. Therefore, no additional components are required for implementation of the low-pass filter. This reduces the size of a receiver structure employing the passive amplifier according to the embodiment of the invention.

Figure 6:
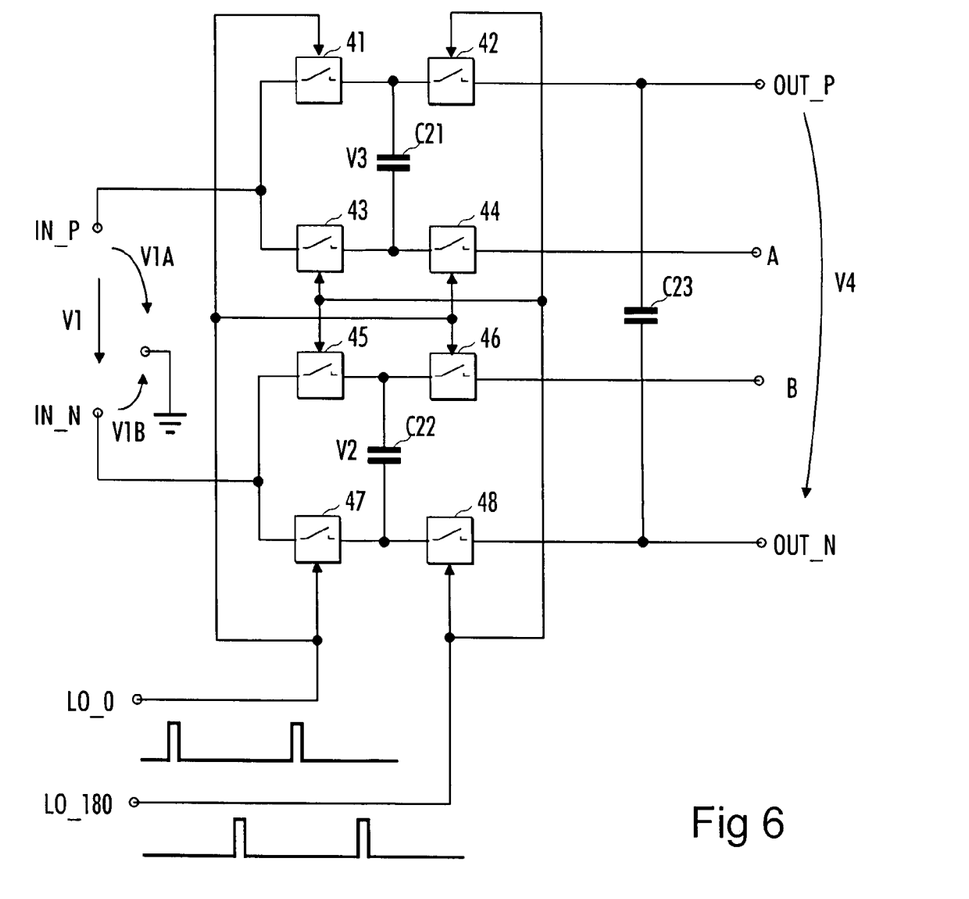
FIG. 6 illustrates a basic structure for a passive amplifier according to an embodiment of the invention.

FIG. 6 illustrates an amplifier configuration similar to that illustrated in FIG. 2. Referring to FIG. 2 and the embodiment described above, the connection ports A and B were connected to the second and the first input port IN_N and IN_P, respectively. In FIG. 6, the connection ports A and B are now open. It is possible to control the amplification or voltage multiplication factor of the amplifier by connecting the connection ports A and B appropriately. FIG. 6 is a starting point for an automatic gain control (AGC) amplifier according to embodiments of the invention.

Figure 7:
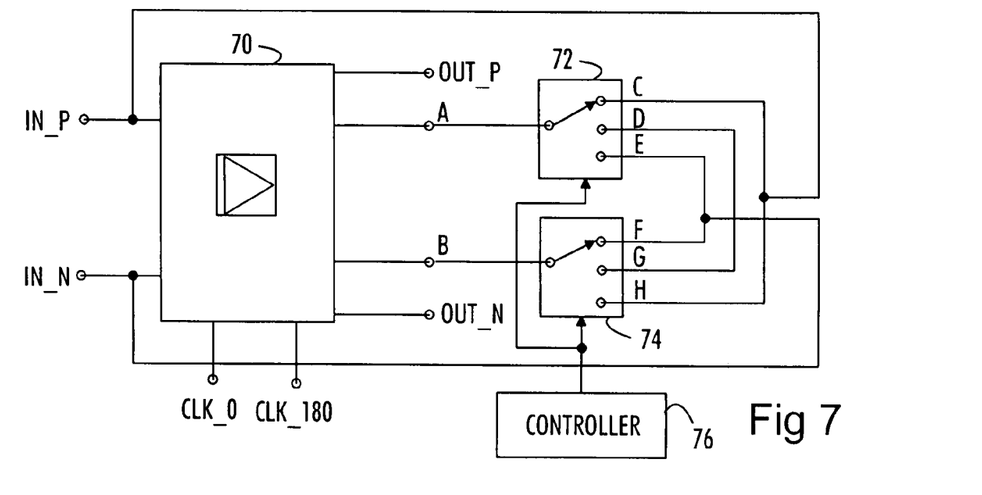
FIG. 7 illustrates an automatic gain control (AGC) passive amplifier structure according to an embodiment of the invention.

In an embodiment illustrated in FIG. 7, the amplifier illustrated in FIG. 6 is now denoted by reference numeral 70. The first connection port A is connected to a first switching mechanism 72 which is configured to connect the first connection port A to one of output ports C, D, or E of the first switching mechanism 72. The second connection port B is connected to a second switching mechanism 74 which is configured to connect the second connection port B to one of output ports F, G, or H of the second switching mechanism 74. Output port C of the first switching mechanism 72 and output port H of the second switching mechanism 74 may be connected to the first input port IN_P of the balanced input port of the amplifier 70. Output port D of the first switching mechanism 72 may be connected to the output port G of the second switching mechanism 74. Output port E of the first switching mechanism 72 and output port F of the second switching mechanism 74 may be connected to the second input port IN_N of the balanced input port of the amplifier 70.

The first and the second switching mechanism may be controlled by a controller 76 according to the desired voltage multiplication factor. The controller 76 may determine the desired voltage multiplication factor according to a method known in the art related to AGC amplifiers. When the desired voltage multiplication factor is three (amplification is 9 dB), the controller 76 may control the first switching mechanism 72 to connect the first connection port A to output port E, i.e. to the second input port IN_N, and the second switching mechanism 74 to connect the second connection port B to output port H, i.e. to the first input port IN_P. This configuration corresponds to the embodiment described above with reference to FIG. 2. Accordingly, the first and the second capacitance C21 and C22 are connected in parallel between the input ports IN_P and IN_N of the balanced input port in the first stage (as illustrated in FIG. 3A) and in series with the third capacitance C23 between the input ports in the second stage (as illustrated in FIG. 3B).

Figure 8A:
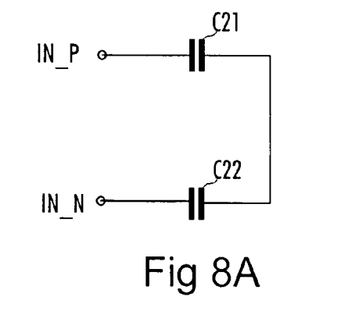
FIG. 8A illustrates an equivalent circuit diagram in a first stage of operation of the AGC passive amplifier having a voltage multiplication factor of two.

When the desired voltage multiplication factor is two (amplification is 6 dB), the controller 76 may control the first switching mechanism 72 to connect the first connection port A to output port D and the second switching mechanism 74 to connect the second connection port B to output port G. In other words, the first connection port A is connected to the second connection port B. Accordingly, the first and the second capacitance C21 and C22 are connected in series between the input ports IN_P and IN_N of the balanced input port in the first stage, as illustrated in FIG. 8A. Now, the voltage between the input ports IN_P and IN_N is divided between the first and the second capacitance in the first stage and, therefore, the voltage charged into the first and the second capacitance, and the voltage multiplication factor of the amplifier is lower than in the case where the capacitances were connected in parallel. If the capacitance values of the first and the second capacitance C21 and C22 are equal, the input voltage is divided equally between the first and the second capacitance. The second stage is again similar to that illustrated in FIG. 3B, i.e. the first, second, and third capacitance C21, C22, and C23 are connected in series between the input ports IN_P and IN_N.

Figure 8B:
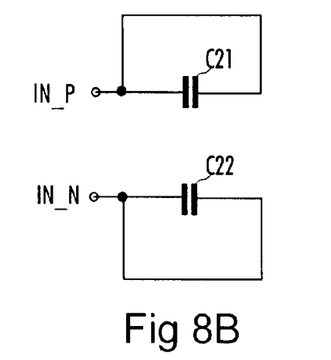
FIG. 8B illustrates an equivalent circuit diagram in a first stage of operation of the AGC passive amplifier having a voltage multiplication factor of one.

When the desired voltage multiplication factor is one, the controller 76 may control the first switching mechanism 72 to connect the first connection port A to output port C, i.e. to the first input port IN_P, and the second switching mechanism 74 to connect the second connection port B to output port F, i.e. to the second input port IN_N. This configuration is illustrated in FIG. 8B. In this case, the first and the second capacitance are not charged in the first stage and, as a result, no voltage multiplication is obtained (amplification is 0 dB). The second stage is again similar to that illustrated in FIG. 3B, i.e. the first, second, and third capacitance C21, C22, and C23 are connected in series between the input ports IN_P and IN_N.

Figure 9:
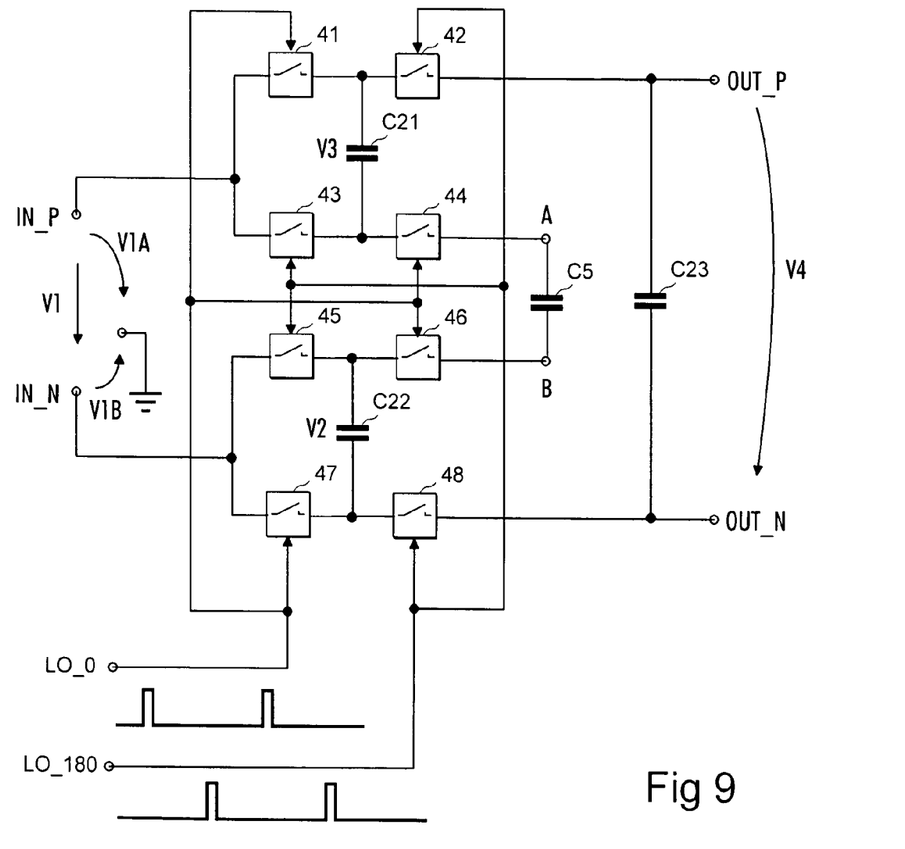
FIG. 9 illustrates the structure of a passive amplifier according to an embodiment of the invention and having an adjustable voltage multiplication factor.

In some cases, the desired voltage multiplication factor may, however, be other than 1 (0 dB), 2 (6 dB), or 3 (9 dB). FIG. 9 illustrates an embodiment of the invention, which is similar to the configuration illustrated in FIG. 6 except that a fourth capacitance C5 is provided between the first and the second connection port A and B. In this embodiment, the first set of switches connects the first, second, and fourth capacitance C21, C22, and C5 in series between the input ports IN_P and IN_N in the first stage. Accordingly, a portion of the total input voltage is charged into the fourth capacitance C5, and the rest of the input total voltage is charged into the first and the second capacitance C21 and C22. The degree of voltage charged into the fourth capacitance C5 depends on the capacitance value of the fourth capacitance with respect to the capacitance values of the first and the second capacitance C21 and C22. In the second stage, the second set of switches connects the first and the second capacitance in series with the third capacitance C23 between the input ports IN_P and IN_N. Now, the voltage charged into the first and the second capacitance C21 and C22 is released into the third capacitance C23 in series with the input voltage. The fourth capacitance C5 may be isolated from the circuit in the second stage.

Figure 10:
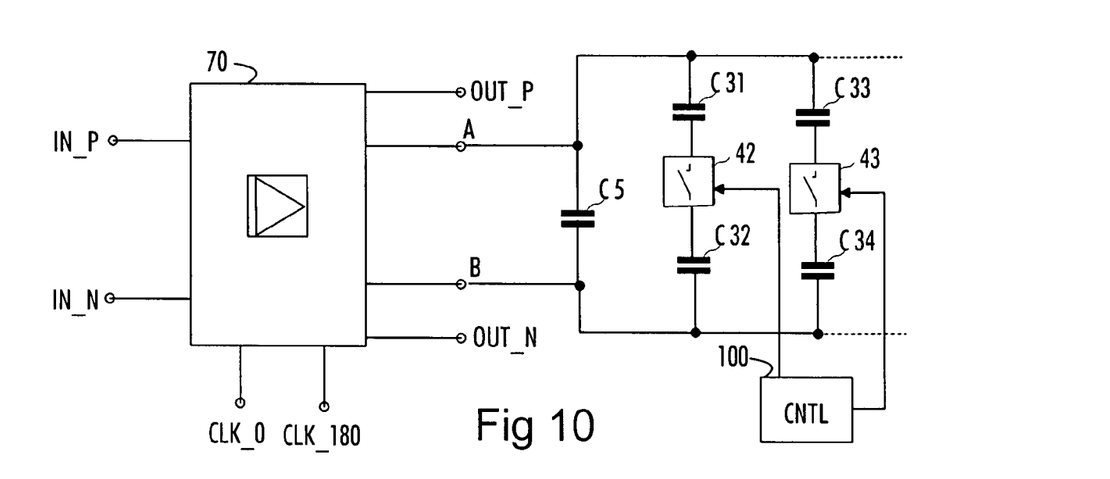
FIG. 10 illustrates an adjustment circuit configured to adjust the voltage multiplication factor of the embodiment illustrated in FIG. 9.

In this embodiment, the amplification depends on the amount of input voltage charged into the fourth capacitance C5, i.e. on the capacitance value of the fourth capacitance C5, according to the following equation:

$$A = \frac{4 \cdot C5 + C21}{2 \cdot C23 + 2 \cdot C5 + C21} \quad (2)$$

where C21, C23, and C5 represent the capacitance values of the first, third, and fourth capacitance C21, C23, and C5, respectively. Here, it is assumed that the capacitance value of the second capacitance C22 equals that of the first capacitance C21. The higher the capacitance value of the fourth capacitance C5 is, the lower is the voltage over the fourth capacitance C5 in the first stage, i.e. the higher is the voltage multiplication factor of the amplifier. The voltage multiplication factor of the amplifier may be adjusted on-the-fly by adjusting the capacitance value of the fourth capacitance C5. For that purpose, an adjustment circuit may be arranged into the amplifier. FIG. 10 illustrates the basic amplifier structure 70 in which the fourth capacitance C5 is provided between the connection ports A and B. In addition to the fourth capacitance, the adjustment circuit is arranged between the connection ports A and B and in parallel with the fourth capacitance C5. The adjustment circuit may comprise capacitances C31, C32, C33, and C34 and switches 42 and 43. The effective capacitance value of the fourth capacitance value, i.e. the additional capacitance contributed to the amplifier circuit 70 by the fourth capacitance, is adjusted by selecting capacitances of the adjustment circuit appropriately in parallel with the fourth capacitance. The capacitances C31, C32, C33, and C34 may be selected by closing and/or opening the switches 42 and 43 appropriately. The operation of the switches 42 and 43 may be controlled by a control signal generator 100. The more capacitances that are connected in parallel with the fourth capacitance C5, the higher is their combined capacitance value, i.e. the higher is the effective capacitance induced by the fourth capacitance C5. The adjustment circuit may comprise more stages than illustrated in FIG. 10, or it may be implemented according to any other method known in the art.

In the embodiment described above with reference to FIG. 9, a maximum voltage multiplication factor of the amplifier is two (6 dB), since the configuration is based on connecting the connection port A to the connection port B (see FIG. 7 for connection D, G in the respective switches 72 and 74).

Figure 11:
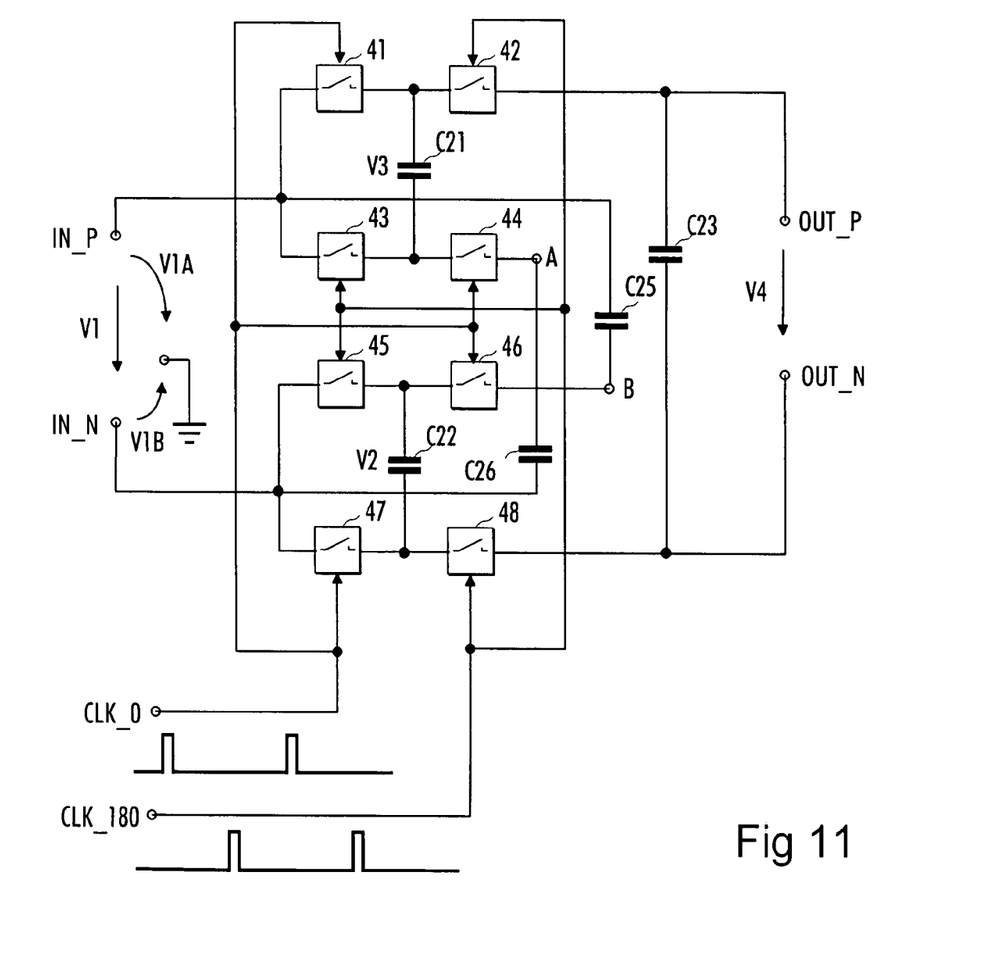
FIG. 11 illustrates the structure of a passive amplifier according to another embodiment of the invention and having an adjustable voltage multiplication factor.

In other words, the amplification may be adjustable up to 6 dB. FIG. 11 illustrates another embodiment in which the maximum voltage multiplication factor of the amplifier is three (9 dB) and the amplification is adjustable up to 9 dB. This embodiment is based on the embodiment illustrated in FIG. 2 in which the first connection port A was connected to the second input port IN_N and the second connection port B was connected to the first input port IN_P. In the embodiment illustrated in FIG. 11, a fifth capacitance C26 is arranged between the first connection port A and the second input port IN_N. Correspondingly, a sixth capacitance C25 is arranged between the second connection port B and the first input port IN_P. Wording "fifth" and "sixth" capacitance is used in order not to cause confusion with the fourth capacitance comprised in the embodiment described above.

In the first stage, the first set of switches connects the first capacitance C21 in series with the fifth capacitance C26 and in parallel with the second and the sixth capacitance C22 and C25 between the input ports IN_P and IN_N. Consequently, the voltage between the input ports IN_P and IN_N is divided between the first and the fifth capacitance C21 and C26 and between the second and the sixth capacitance C22 and C26. Therefore, the voltage over the first capacitance C21 depends on the capacitance value of the fifth capacitance C26 and the voltage over the second capacitance C22 depends on the capacitance value of the sixth capacitance C25. The higher is the capacitance values of the fifth and the sixth capacitance C26 and C25, the higher is the voltage over the first and the second capacitance C21 and C22, respectively. The second stage is similar to the embodiments described above, i.e. the second set of switches connects the first and the second capacitance C21 and C22 in series with the third capacitance C23 between the input ports IN_P and IN_N. Accordingly, the fifth and the sixth capacitance C26 and C25 are isolated from the circuit in the second stage.

The capacitance values of the fifth and the sixth capacitance C26 and C25 may be adjusted according to the desired voltage multiplication factor. For example, an adjustment circuit similar to that illustrated in FIG. 11 may be arranged in parallel with each of the fifth and the sixth capacitance C26 and C25. The amplification of the amplifier may be calculated from the capacitance values according to the following equation:

$$A = \frac{3 \cdot C26 + C21}{C26 + C21 + 2 \cdot C23}, \quad (3)$$

where C21, C23, and C26 represent the capacitance values of the first, third and fifth capacitance, respectively. In this case, it is assumed that the second capacitance C22 and the sixth capacitance C25 have the same capacitance values as the first and the fifth capacitance C21 and C26, respectively. It should be noted that equation (3) is simplified in the sense that it does not take into account on-resistances of the switches 41 to 48 and input and output impedances of the amplifier. The same simplification has been applied to equation (3), too.

Figure 12:
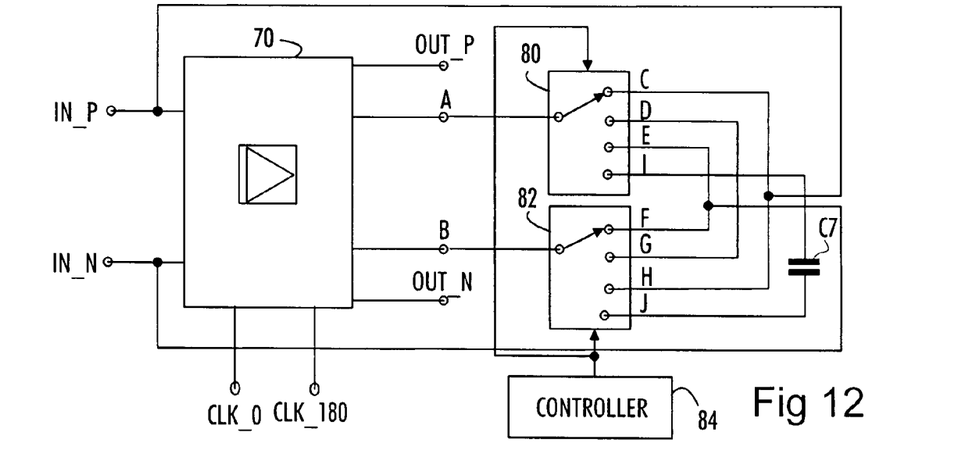
FIG. 12 illustrates an automatic gain control (AGC) passive amplifier structure according to another embodiment of the invention.

Embodiment illustrated in FIG. 7 comprising the switches 72 and 74 controlled according to the desired voltage multiplication factor may still be improved by providing a fourth optional connection for the connection ports. In the embodiment illustrated in FIG. 7, the possible voltage multiplication factors were one, two, and three, that is amplification of 0, 6, and 9 dB. FIG. 12 illustrates an embodiment of the invention in which a fourth voltage multiplication factor may be selected with by connecting the connection ports A and B appropriately. The fourth voltage multiplication factor may be 1.4 (amplification is 3 dB), for example. The embodiment illustrated in FIG. 12 comprises switching mechanisms 80 and 82, both having one input port and four output ports. Output ports C, D, and E of switching mechanism 80 are connected as those of the first switching mechanism 72 described above with reference to FIG. 7. Correspondingly, output ports F, G, and H of switching mechanism 82 are connected as those of the second switching mechanism 74.

Both switching mechanisms 80 and 82 comprise an additional output port which are connected to each other through an additional capacitance C7 (seventh capacitance). Accordingly, output port I of switching mechanism 80 is connected to output port J of switching mechanism 82 through the seventh capacitance C7. The capacitance value of the seventh capacitance C7 may be selected to provide a desired amplification factor (3 dB, for example) for the amplifier.

Switching mechanisms 80 and 82 may be controlled by a controller 84. The controller 84 may have a functionality similar to the controller 76 described above with reference to FIG. 7. The only difference is that the switching mechanisms 80 and 82 now have four output ports, and the controller selects the desired voltage multiplication factor from a set of four possible factors.

With the embodiments having adjustable voltage multiplication factor as described above, the passive amplifier may be implemented with automatic gain control functionality. This feature is very practical in radio transceivers, since the level of a received radio signal may have high variations.

In general, the embodiments of the invention are advantageous in multi-mode radio receivers (or transceivers) operating at multiple frequency bands and requiring high linearity and noise figures from the receiver components. In such transceivers, it is generally difficult to arrange a low-noise amplifier (amplifier 2 in FIG. 1) followed by filters changeable according to the current frequency band. If the filters following the low-noise amplifier are omitted, the amplification of the low-noise amplifier should typically be lowered and, as a result, noise figures of amplifiers following a downmixer (4 and 5 in FIG. 1) have to be reduced. The embodiments of the invention comprise a passive amplifier having low noise figures and functioning also as a low-pass switched capacitor filter without an increase in components or increase in the size of an actual implementation (integrated circuit, for example).

In practice, the passive amplifier according to embodiments of the invention may be implemented by arranging the first set of switches to respond to the first oscillator signal and the second set of switches to respond to the second oscillator signal, as described above. In that case, the first and the second oscillator signals may be different oscillator signals and the individual switches may have the same functionality, i.e. a switch may be closed when the level of an oscillator signal controlling the switch is high and open when the level of the oscillator signal is low. Alternatively, the first and the second set of switches may be arranged to respond to the same oscillator signal which may be the first or the second oscillator signal. In this case, the first set of switches may be arranged to be closed when the level of the oscillator signal is high (and open otherwise), and the second set of switches may be arranged to be closed when the level of the oscillator signal is low (and open otherwise). This functionality may be achieved by implementing the first set of switches by NMOS transistors and the second set of switches by PMOS transistors, for example. Accordingly, the operation of the first and the second set of switches may be complementary in the sense that both sets of switches are not closed at the same time.

In the description above, it is mentioned that the first and the second oscillator signals may have the same frequency. Accordingly, the oscillator signals may have different pulse ratios and/or pulse shapes, for example, as long as the first and the second set of switches are not closed at the same time. The first and the second oscillator signals may also have opposite phases.

Figure 13:
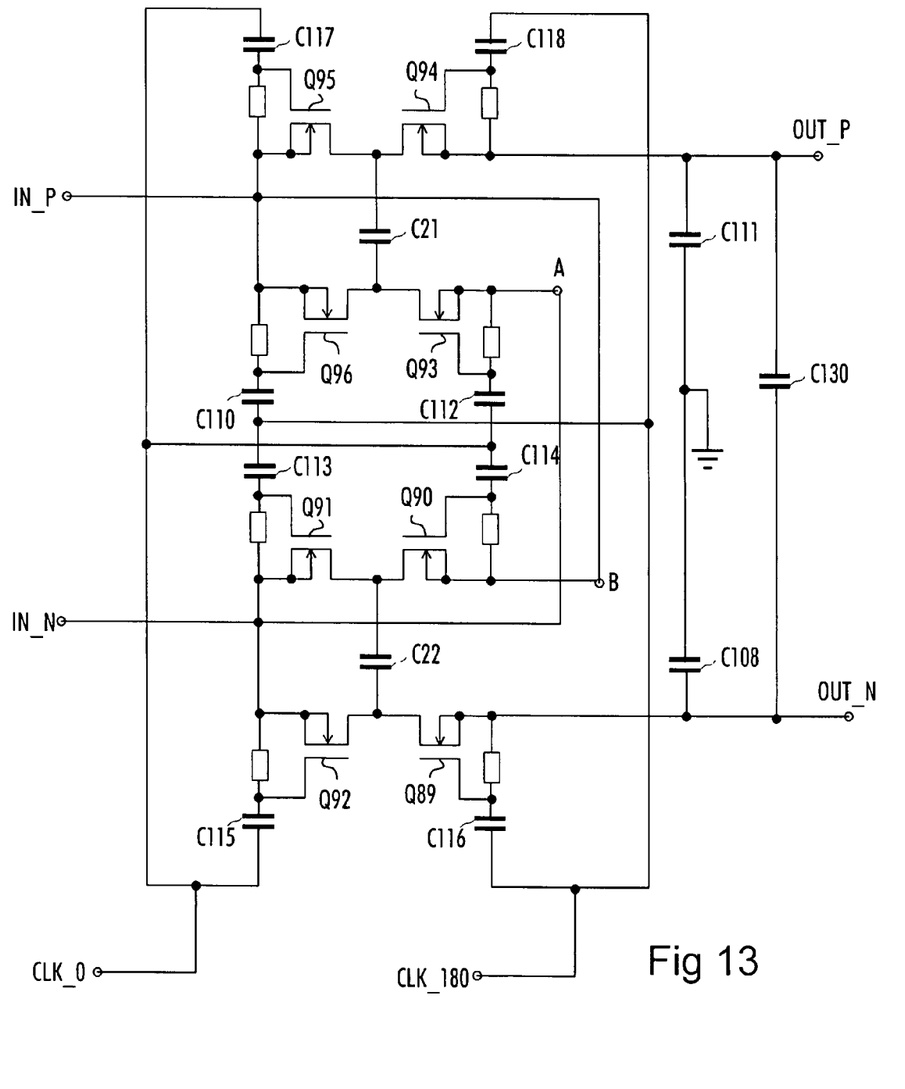
FIG. 13 illustrates an implementation of the passive amplifier illustrated in FIG. 2.

FIG. 13 illustrates an example of a practical implementation of the amplifier illustrated in FIG. 2. Each of the switches 41 to 48 may be implemented by a single MOS transistor Q89 to Q96. The oscillator signals CLK_0 and CLK_180 may be applied to the gates of the corresponding switches through a small capacitor C110 and C112 to C118.

The third capacitance C23 may be implemented by three capacitors C111, C108 and C130. Capacitor C130 may be connected in parallel with capacitors C111 and C108, and capacitors C111 and C108 may be connected in series, as shown in FIG. 12. Capacitance values of capacitors C111 and C108 may be very small compared with the capacitance value of capacitor C130, and the main purpose of capacitors C111 and C108 may be to attenuate common mode oscillator signals.

While the embodiments are described above in conjunction with balanced input and output ports, an embodiment employing dual balanced input ports and output ports may be formed by arranging two balanced passive amplifier structures in parallel and providing input signals into corresponding balanced input ports of the parallel structures in opposite phases.

It is obvious to one skilled in the art that the embodiments of the invention may be carried out in numerous ways in terms of practical implementation. For example, the switches 41 to 48 or Q89 to Q96 may be realized with GaAs field effect transistors, SOI-CMOS transistors, diodes, etc. Additional components may also be included in the embodiments described above, depending on the practical implementation. The embodiments may be realized on an integrated circuit, a printed circuit board, or any other material. Applications of the embodiments include radio transceivers or radio transmitters or receivers according to the following exemplary technologies: mobile telephones, Global Positioning System (GPS), Galileo, Wireless Local Area Network (WLAN), Bluetooth®, FM radio, television receivers, digital video broadcasting for handheld devices (DVB-H), AM receivers, audio amplifiers, measuring instruments, etc.

Even though the invention has been described above with reference to an example according to the accompanying drawings, it is clear that the invention is not restricted thereto but it can be modified in several ways within the scope of the appended claims.

The invention claimed is:

1. A method, comprising:
receiving an input signal voltage into a first input port and a second input port of a balanced input port;
connecting, in a first stage, in response to a first oscillator signal, a first terminal of a first capacitance to the first input port, a second terminal of the first capacitance to the second input port, a first terminal of a second capacitance to the first input port, and a second terminal of the second capacitance to the second input port;
connecting, in a second stage, in response to a second oscillator signal, the first terminal of the first capacitance to a first terminal of a third capacitance, the second terminal of the first capacitance to the first input port, the first terminal of the second capacitance to the second input port, and the second terminal of the second capacitance to a second terminal of the third capacitance; and
obtaining a voltage over the third capacitance as an output voltage.

2. The method of claim 1, further comprising:
charging, in the first stage, the first capacitance and the second capacitance with a voltage corresponding to the voltage over the first input port and the second input port; and
releasing, in the second stage, the charge in the first capacitance and the second capacitance into the third capacitance in series with the current voltage over the first input port and the second input port, to produce a voltage over the third capacitance, which is the sum of the voltage over the first capacitance in the first stage, the voltage over the second capacitance in the first stage, and the current voltage over the first input port and the second input port.

3. The method of claim 1, further comprising:
producing the first oscillator signal and the second oscillator signal from a local oscillator signal used for downmixing a received radio signal.

4. The method of claim 1, further comprising:
connecting, in the first stage, the first capacitance and the second capacitance between the first input port and the second input port either in series or in parallel depending on a desired voltage multiplication factor of the output signal.

5. The method of claim 4, further comprising:
connecting, in the first stage, the first capacitance and the second capacitance between the first input port and the second input port in series when the desired voltage multiplication factor is two and in parallel when the desired voltage multiplication factor is three.

6. The method of claim 4, further comprising:
connecting the first terminal and the second terminal of the first capacitance to the first input port in the first stage; and
connecting the first terminal and the second terminal of the second capacitance to the second input port in the first stage when the desired voltage multiplication factor is one.

7. The method of claim 4, further comprising:
connecting, in the first stage, the first capacitance and the second capacitance in series between the first input port and the second input port; and
providing, in series with the first and the second capacitance, an additional capacitance having a capacitance value determined according to the desired voltage multiplication factor.

8. The method of claim 1, further comprising:
configuring the frequencies of the first oscillator signal and the second oscillator signal to be higher than the highest frequency component of input signals at the input ports.

9. The method of claim 1, further comprising:
defining a corner frequency of a low-pass filter with the capacitance values of the first capacitance, the second capacitance, and the third capacitance; and
low-pass filtering an input signal input to the first and the second input port.

10. The method of claim 1, further comprising:
connecting, in the first stage, the first capacitance and the second capacitance between the first input port and the second input port in series; and
providing a fourth capacitance in series between the first capacitance and the second capacitance in the first stage, wherein the capacitance value of the fourth capacitance is adjustable to enable adjustable voltage multiplication.

11. The method of claim 1, further comprising:
connecting, in the first stage, the first capacitance and the second capacitance between the first input port and the second input port in series;
providing a fourth capacitance in series with the first capacitance in the first stage; and
providing a fifth capacitance in series with the second capacitance in the first stage,
wherein the capacitance values of the fourth capacitance and the fifth capacitance are adjustable to enable adjustable voltage multiplication.

12. The method of claim 1, further comprising:
configuring the first stage to be the first half cycle of the oscillator signals; and configuring the second stage to be the second half cycle of the oscillator signals.

13. The method of claim 1, further comprising:
configuring the first oscillator signal and the second oscillator signal to be a same oscillator signal.

14. The method of claim 1, further comprising:
configuring the first oscillator signal and the second oscillator signal to have a same frequency and different phases.

15. An apparatus, comprising:
an input interface comprising a balanced input port configured to receive a balanced input signal and an oscillator signal input port configured to receive a first oscillator signal and a second oscillator signal;
a first capacitance;
a second capacitance;
a third capacitance;
a first set of switches responsive to the first oscillator signal and configured to connect, when closed in response to the first oscillator signal, the first and the second capacitance between a first input port and a second input port of the balanced input port, wherein the first set of switches is configured to connect, when closed, a first terminal of the first capacitance and a first terminal of the second capacitance to the first input port and a second terminal of the first capacitance and a second terminal the second capacitance to the second input port;
a second set of switches responsive to the second oscillator signal and configured to connect, when closed in response to the second oscillator signal, the first capacitance between the first input port and the third capacitance, and the second capacitance between the second input port and the third capacitance, wherein the second set of switches is configured to connect, when closed, the first terminal of the first capacitance to a first terminal of the third capacitance, the second terminal of the first capacitance to the first input port, the first terminal of the second capacitance to the second input port, and the second terminal of the second capacitance to a second terminal of the third capacitance; and
an output port connected to terminals of the third capacitance.

16. The apparatus of claim 15, wherein the first oscillator signal and the second oscillator signal are a same oscillator signal.

17. The apparatus of claim 15, wherein the first oscillator signal and the second oscillator signal have a same frequency and different phases.

18. The apparatus of claim 15, further comprising:
a local oscillator signal generator configured to apply the first oscillator signal and the second oscillator signal to the oscillator input port.

19. The apparatus of claim 18, wherein the local oscillator signal generator is configured to produce the first oscillator signal and the second oscillator signal from a local oscillator signal used for downmixing a received radio signal.

20. The apparatus of claim 18, wherein the local oscillator signal generator is configured to produce the first oscillator signal and the second oscillator signal to have a frequency higher than the highest expected frequency component of input signals at the input ports.

21. The apparatus of claim 15, further comprising:
a controllable switching mechanism configured to connect, when the first set of switches is closed, the first capacitance and the second capacitance between the first input port and the second input port either in series or in parallel depending on a desired voltage multiplication factor effected by the apparatus on an input signal input to the balanced input port.

22. The apparatus of claim 21, wherein the switching mechanism is configured to connect the first capacitance and the second capacitance between the first input port and the second input port in series when the desired voltage multiplication factor is two and in parallel when the desired voltage multiplication factor is three.

23. The apparatus of claim 21, wherein the switching mechanism is further configured to connect, when the first set of switches is closed, two terminals of the first capacitance to the first input port and two terminals of the second capacitance to the second input port when the desired voltage multiplication factor is one.

24. The apparatus of claim 21, further comprising:
an additional capacitance having a capacitance value determined according to the desired voltage multiplication factor,
wherein the switching mechanism is configured to connect the first capacitance and the second capacitance in series with the additional capacitance between the first input port and the second input port.

25. The apparatus of claim 15, wherein the apparatus is configured to function as a low-pass filter having a corner frequency defined by a ratio of the capacitance values of the first capacitance, the second capacitance, and the third capacitance.

26. The apparatus of claim 15, wherein
the first set of switches comprises a first switch connected between the first input port and a first terminal of the first capacitance, a second switch connected between the second input port and a second terminal of the first capacitance, a third switch connected between the first input port and a first terminal of the second capacitance, and a fourth switch connected between the second input port and a second terminal of the second capacitance, and
the second set of switches comprises a fifth switch connected between the first terminal of the first capacitance and a first terminal of the third capacitance, a sixth switch connected between the first input port and the second terminal of the first capacitance, a seventh switch connected between the second input port and the first terminal of the second capacitance, and an eighth switch connected between the second terminal of the second capacitance and a second terminal of the third capacitance.

27. The apparatus of claim 15, further comprising:
a fourth capacitance,
wherein the first set of switches is configured to connect, when closed, the fourth capacitance together with the first capacitance and the second capacitance in series between the first input port and the second input port of the balanced input port.

28. The apparatus of claim 27, further comprising:
an adjustment circuit configured to adjust the capacitance value of the fourth capacitance and to control a voltage multiplication factor of the apparatus.

29. The apparatus of claim 15, further comprising:
a fifth capacitance; and
a sixth capacitance,
wherein the first set of switches is configured to connect, when closed, the fifth capacitance in series with the first capacitance, the sixth capacitance in series with the second capacitance, and the first capacitance and the fifth capacitance in parallel with the second capacitance and the sixth capacitance between the first input port and the second input port of the balanced input port.

30. The apparatus of claim 29, further comprising:
an adjustment circuit configured to adjust the capacitance value of the fifth capacitance and the sixth capacitance and to control a voltage multiplication factor of the apparatus.

31. An automatic gain control amplifier, comprising:
an input interface comprising a balanced input port configured to receive a balanced input signal and an oscillator signal input port configured to receive a first oscillator signal and a second oscillator signal;
a first capacitance;
a second capacitance;
a third capacitance;
a first set of switches responsive to the first oscillator signal and configured to connect, when closed in response to the first oscillator signal, the first and the second capacitance between a first input port and a second input port of the balanced input port, wherein the first set of switches is configured to connect, when closed, a first terminal of the first capacitance and a first terminal of the second capacitance to the first input port and a second terminal of the first capacitance and a second terminal the second capacitance to the second input port;
a second set of switches responsive to the second oscillator signal and configured to connect, when closed in response to the second oscillator signal, the first capacitance between the first input port and the third capacitance, and the second capacitance between the second input port and the third capacitance, wherein the second set of switches is configured to connect, when closed, the first terminal of the first capacitance to a first terminal of the third capacitance, the second terminal of the first capacitance to the first input port, the first terminal of the second capacitance to the second input port, and the second terminal of the second capacitance to a second terminal of the third capacitance; and
an output port connected to terminals of the third capacitance.

32. A radio transmitter comprising an amplifier, comprising:
an input interface comprising a balanced input port configured to receive a balanced input signal and an oscillator signal input port configured to receive a first oscillator signal and a second oscillator signal;
a first capacitance;
a second capacitance;
a third capacitance;
a first set of switches responsive to the first oscillator signal and configured to connect, when closed in response to the first oscillator signal, the first and the second capacitance between a first input port and a second input port of the balanced input port, wherein the first set of switches is configured to connect, when closed, a first terminal of the first capacitance and a first terminal of the second capacitance to the first input port and a second terminal of the first capacitance and a second terminal the second capacitance to the second input port;
a second set of switches responsive to the second oscillator signal and configured to connect, when closed in response to the second oscillator signal, the first capacitance between the first input port and the third capacitance, and the second capacitance between the second input port and the third capacitance, wherein the second set of switches is configured to connect, when closed, the first terminal of the first capacitance to a first terminal of the third capacitance, the second terminal of the first capacitance to the first input port, the first terminal of the second capacitance to the second input port, and the second terminal of the second capacitance to a second terminal of the third capacitance; and
an output port connected to terminals of the third capacitance.

33. An apparatus, comprising:
input means comprising a balanced input port for receiving a balanced input signal and an oscillator signal input port for receiving a first and a second oscillator signal;
first capacitance means for holding charge;
second capacitance means for holding charge;
third capacitance means for holding charge;
first switching means responsive to the first oscillator signal for connecting, when closed in response to the first oscillator signal, the first capacitance means and the second capacitance means between a first input port and a second input port of the balanced input port, wherein the first switching means connect, when closed, a first terminal of the first capacitance and a first terminal of the second capacitance to the first input port and a second terminal of the first capacitance and a second terminal the second capacitance to the second input port;
second switching means responsive to the second oscillator signal for connecting, when closed in response to the second oscillator signal, the first capacitance means between the first input port and the third capacitance means and the second capacitance means between the second input port and the third capacitance means, wherein the second switching means connect, when closed, the first terminal of the first capacitance to a first terminal of the third capacitance, the second terminal of the first capacitance to the first input port, the first terminal of the second capacitance to the second input port, and the second terminal of the second capacitance to a second terminal of the third capacitance; and
output means connected to terminals of the third capacitance means.

* * * * *